(12) United States Patent
Li et al.

(10) Patent No.: US 11,276,553 B2
(45) Date of Patent: Mar. 15, 2022

(54) DEVICE FOR MEASURING EMISSION ANGLE OF PARTICLE BEAM

(71) Applicant: University of Electronic Science and Technology of China, Chengdu (CN)

(72) Inventors: Hailong Li, Chengdu (CN); Tongkun Zou, Chengdu (CN); Maoyan Wang, Chengdu (CN); Yong Yin, Chengdu (CN); Bin Wang, Chengdu (CN); Lin Meng, Chengdu (CN); Ping Zhang, Chengdu (CN); Xuesong Yuan, Chengdu (CN); Huanhuan Lu, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 17/086,494

(22) Filed: Nov. 2, 2020

(65) Prior Publication Data
US 2021/0134558 A1    May 6, 2021

(30) Foreign Application Priority Data
Oct. 31, 2019    (CN) .......................... 201911048797.1

(51) Int. Cl.
*H01J 37/244*    (2006.01)

(52) U.S. Cl.
CPC ..... *H01J 37/244* (2013.01); *H01J 2237/2448* (2013.01)

(58) Field of Classification Search
CPC ............ H01J 37/244; H01J 2237/2448; G01T 1/2907; G01T 5/00; G01L 5/00
See application file for complete search history.

(56) References Cited

U.S. PATENT DOCUMENTS

2020/0187887 A1 * 6/2020 Alon Cohen .......... A61B 6/547

FOREIGN PATENT DOCUMENTS

| CN | 110686817 A | * | 1/2020 | |
| EP | 2182546 A2 | * | 5/2010 | .............. H01J 37/28 |
| WO | WO-2009045722 A1 | * | 4/2009 | .......... H01J 37/3053 |
| WO | WO-2019215211 A1 | * | 11/2019 | .............. G01S 17/46 |

* cited by examiner

*Primary Examiner* — David A Vanore
(74) *Attorney, Agent, or Firm* — Matthias Scholl P.C.; Matthias Scholl

(57) ABSTRACT

A device for measuring the emission angle of a particle beam. The device includes a shell, a data acquisition board, a data collector, a data processor and a data synchronization display. The shell is hollow tubular. The data acquisition board is fixed to the front end of the shell. The data collector and the data processor are fixed together and fixed to the back end of the shell. The data collected by the data acquisition board is transmitted to the data collector through the data line collector, and the data processor transmits the processed data to the data synchronization display. The ion accelerator to be measured is located in front of the data acquisition board, and the particles emitted by the ion accelerator bombard the front of the data acquisition board. The data acquisition board comprises an insulating ring, an array insulating board and a pressure sensor.

5 Claims, 6 Drawing Sheets

DEVICE FOR MEASURING EMISSION ANGLE OF PARTICLE BEAM

CROSS-REFERENCE TO RELAYED APPLICATIONS

Pursuant to 35 U.S.C. § 119 and the Paris Convention Treaty, this application claims foreign priority to Chinese Patent Application No. 201911048797.1 filed on Oct. 31, 2019, the contents of which, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, Mass. 02142.

BACKGROUND

The disclosure relates to a device for measuring an emission angle of a particle beam.

Space debris is a term for defunct human-made objects in space—principally in Earth orbit—which no longer serve a useful function. Space debris has posed a serious threat to space activities and combating space debris pollution is urgent and important.

For the neutral particle beam, because it is not charged, it is impossible to measure its emission directly by measuring the charged particle beam. At present, the common methods of measuring particle beam energy in laboratory include range method, energy sensitive detector measurement method and magnetic analysis method. The common spectrometer can be divided into ionization chamber type, semiconductor detector type, photodetector type, etc. However, it measures the energy and energy spectrum characteristics of the particle beam. It is also used to study the important parameters provided by the biological effect of space radiation on the human body, as well as the measurement of the planetary water search task, the life phenomenon outside the earth, the mixed radiation environment of the planetary surface, and so on.

SUMMARY

The disclosure provides a device for measuring the emission angle of a particle beam, the device comprising a shell, a data acquisition board, a data collector, a data processor and a data synchronization display. The shell is hollow tubular. The data acquisition board is fixed to the front end of the shell. The data collector and the data processor are fixed together and fixed to the back end of the shell. The data collected by the data acquisition board is transmitted to the data collector through the data line collector, and the data processor transmits the processed data to the data synchronization display. The ion accelerator to be measured is located in front of the data acquisition board, and the particles emitted by the ion accelerator bombard the front of the data acquisition board. The data acquisition board comprises an insulating ring, an array insulating board and a pressure sensor. The insulating ring is arranged between the array insulating board and the shell, and the array insulating board is embedded in the insulating ring. The array is provided with a pressure sensor mounting hole on the array insulating board, and a pressure sensor is installed on the front of the array insulating board corresponding to each pressure sensor mounting hole. The pressure sensor is connected to the data collector from the back of the array insulating board.

The pressure sensor comprises a pressure sensing surface, a mounting body, a central position positioned on one side of the pressure sensing surface, a data line transmitting the pressure sensor data passing through the mounting body to connect the pressure sensing surface. The pressure sensing surface is arranged on the front side of the array insulating board. The end diameter of the mounting body is larger than the diameter of the pressure sensor mounting hole, and the mounting body is clamped in the pressure sensor mounting hole. The pressure sensing surface comprises the resistors $R_1$, $R_2$, $R_3$, $R_4$ and an elastic equalizing beam. The resistors $R_1$ and $R_3$ are pasted respectively in the upper surface of the elastic equalizing beam and the resistors $R_2$ and $R_4$ are pasted respectively in the lower surface of the elastic equalizing beam, in which the hollow part is a dumbbell shape with two ends large and middle small, and the resistor is arranged on the upper or lower surface of the elastic equalizing beam corresponding to the two ends of the hollow part. There is a connection between the resistors $R_1$, $R_2$, $R_3$ and $R_4$ and the data line. The pressure is calculated by measuring the change of the resistor.

The pressure sensor comprises a power supply end and a data acquisition end; the power supply end of all pressure sensors is connected in equalizing, and the data acquisition end is separately connected to the data collector.

When the data acquisition board is rectangular, the pressure sensing surface of the pressure sensor is set to rectangle, and when the data acquisition board is circular, the pressure sensing surface of the pressure sensor is set to circle.

The array insulating board is made of polymer synthetic resin, and the insulation ring is made of Teflon material.

The following advantages are associated with the device for measuring an emission angle of a particle beam according to embodiments of the disclosure:

1) The device solves the difficulty that the laboratory equipment cannot measure the mechanical characteristics of the particle beam by using a sensor array device, and the pressure sensor in the disclosure is distributed on the array insulating board, that is, the sensor array is insulated, and the measurement accuracy is further improved.

2) The device adopts a sensor array, which can receive all particles emitted from the transmitting set, and further provides the accuracy of the measurement results.

3) The measuring circuit of the pressure sensor in the disclosure can work in the DC state, and it is easier to accurately control and measure than the AC circuit without the influence of frequency.

4) The device can be used for space debris removal in the aerospace field. When it is possible to measure the magnitude of the thrust of the particles emitted from the neutral particle beam, the control satellite can adjust the magnitude of the force of the particles emitted from different emission angles and accurately emit high energy particle beams to different size debris targets, thus making the removal task more accurate and greatly reducing the removal cost. The disclosure is not limited to neutral particle beam, other particle beams are also applicable, and the application range is wider.

Among them, 1—Particle accelerator, 2—Insulation ring, 3—Shell, 4—Pressure sensor, 5—Array insulating board, 6—Data collector, 7—Data processor, 8—Data synchronization display, 9—Data lines, 10—Elastic equalizing beam.

DETAILED DESCRIPTION

Example 1

Figure 1:
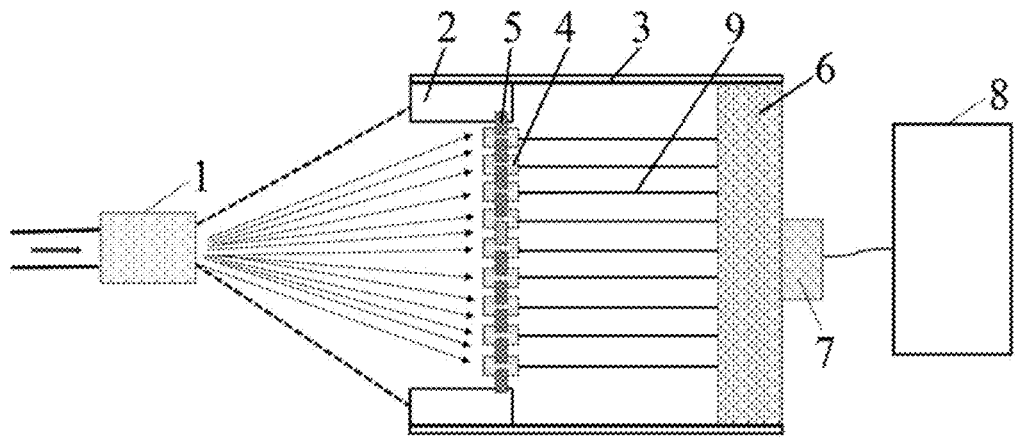
FIG. 1 is a schematic diagram of the particle beam measuring device of the disclosure.
Figure 2:
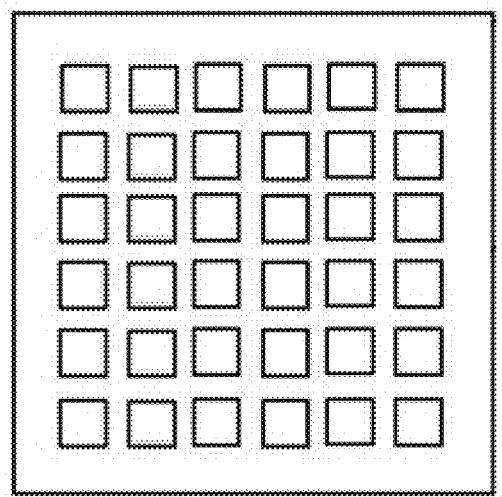
FIG. 2 is a schematic diagram of the front layout when the data acquisition board is rectangular.

FIG. 1 is a schematic diagram of the particle beam measuring device of the disclosure. As shown in FIG. 1, this disclosure provides a measuring device for the emission angle of a particle beam. The device can measure the impact characteristics of a neutral particle beam by a highly sensitive pressure sensor, and the mechanical effects of neutral particle beams. This device comprises a particle accelerator 1, an insulation ring 2, a shell 3, a pressure sensor 4, an array insulating board 5, a data collector 6, a data processor 7 and a data synchronization display 8. There is a distance between the particle accelerator 1 and the pressure sensor according to the actual measurement needs. The pressure sensor is connected to the data collector 6 through a corresponding pin and wire. The data collector 6 is connected to the data processor 7 through its corresponding interface. There are several synchronous display windows in synchronous display 8, corresponding to the experimental results of each sensor in the pressure sensor array. The data processor 7 is connected to the data synchronization display 8; the pressure sensor 4 is distributed on the array insulating board 5; each pressure sensor is a piezoresistive pressure sensor. There is a gap between the adjacent pressure sensors and mutual bite distributed on the array insulating board 5, and there is electrical insulation between any two pressure sensors, each pressure sensor is provided with four resistors, that is, resistor $R_1$, resistor $R_2$, resistor $R_3$ and resistor $R_4$, and an elastic equalizing beam. The resistor $R_1$ and resistor $R_3$ respectively are pasted on the upper surface of the elastic equalizing beam, and the resistor $R_2$ and resistor $R_4$ are respectively pasted on the lower surface of the elastic equalizing beam.

Figure 7:
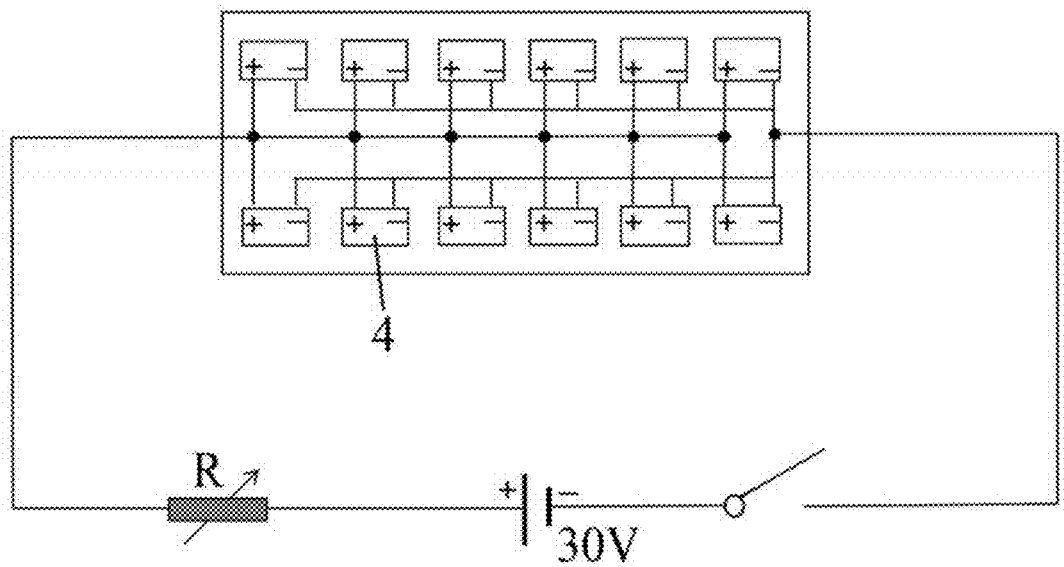
FIG. 7 is a schematic diagram of the connection relationship between all pressure sensor power supply pins of the disclosure.

FIG. 7 is a schematic diagram of the connection circuit between the switch and the pressure sensor in the disclosure; the whole circuit comprises 30 V of power supply, variable resistor, switch and pressure sensor array. Each pressure sensor has a pair of positive and negative poles connected to the circuit. The whole connection mode of the circuit is series. Specifically, the two rows of pressure sensors in the pressure sensor array are connected in equalizing through wires. The biggest advantage of this method is to greatly reduce the number of conductors, especially in the wiring of the whole array. Switch is used to control the opening and closing state of the circuit. The function of the variable resistor R is to adjust the current of the whole circuit and ensure the safety of the whole circuit.

Figure 6:
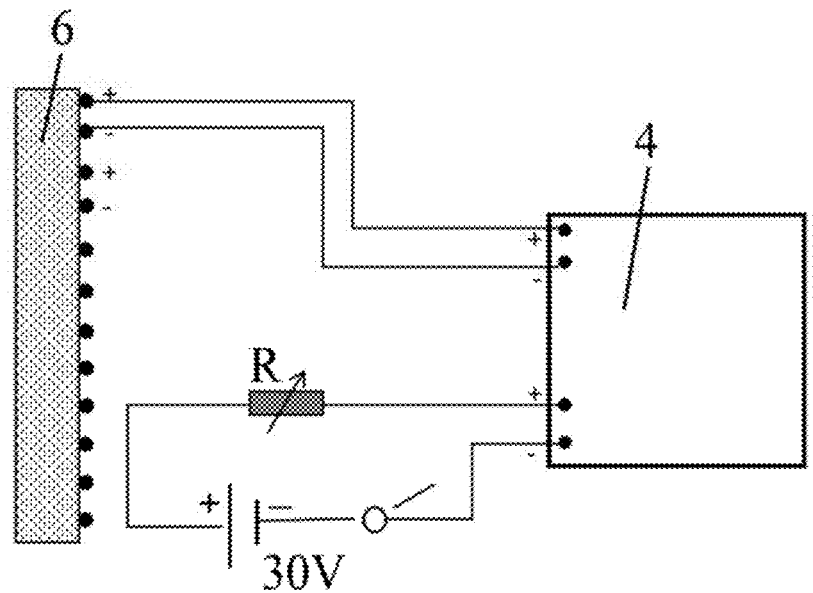
FIG. 6 is a schematic diagram of the connection between the data collector and the pressure sensor in the disclosure.

FIG. 6 is a schematic diagram of the connection between the data collector and the pressure sensor in the disclosure.

There are several positive and negative pins on the data collector, which are arranged vertically and each pin is connected to a pressure sensor; each pressure sensor has two sets of pins; one pin is for power supply and the other is for data measurement, which is used for transmitting the results of each pressure sensor to the data collector.

Figure 3:
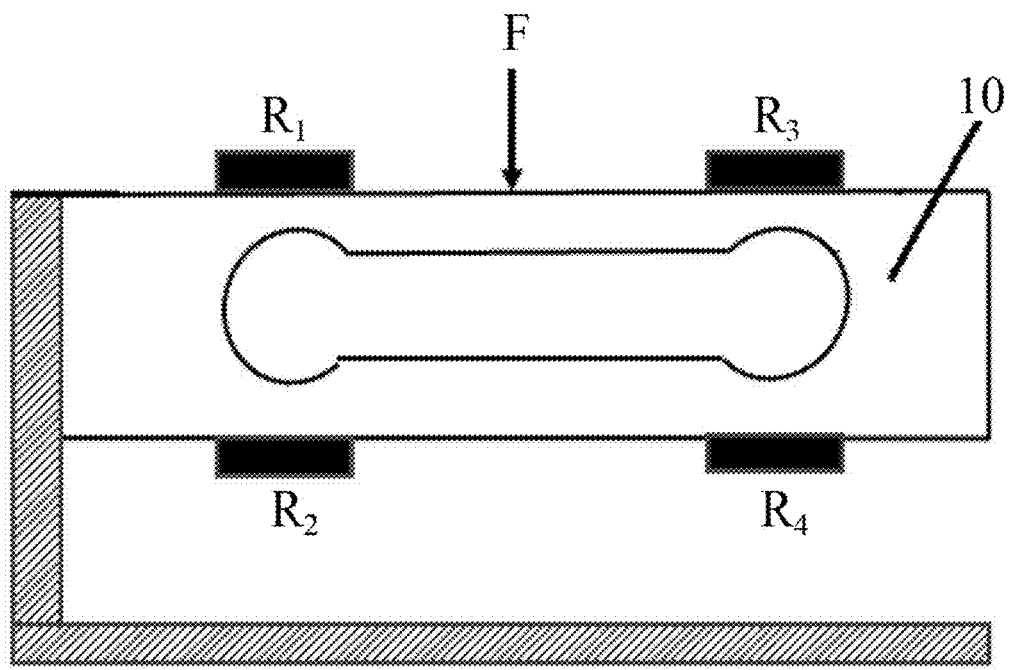
FIG. 3 is a schematic diagram of the principle of a high sensitivity pressure sensor used in the disclosure.

FIG. 3 is a schematic diagram of a high sensitivity pressure sensor used in the disclosure. The pressure sensor sticks four resistors $R_1$, $R_2$, $R_3$ and $R_4$ on the upper and lower surfaces of the elastic parallel beam 10 respectively at appropriate positions; one end of the beam is fixed and the other side is free, which is used to load the impact force F. The elastic equalizing beam is bent because of the effect of load, and the upper surface of the beam is pulled, and the value of its corresponding resistors $R_1$ and $R_3$ increase because of the pulled force. In the same way, the lower surface of the beam is pressed, and the value of its corresponding resistor $R_2$ and $R_4$ then decrease because of the pressed force. All the pressure sensors are connected to the data processing module, which integrates the total data collector 6 and the total data processor 7 to collect and process all the data from the pressure sensor. Each pressure sensor corresponds to a display. The final result is displayed synchronously by display array. The high sensitivity pressure sensor can measure the force of millimeter (mN) level, thus observing the mechanical distribution of the charged particle beam very intuitively.

The neutral particle beam emitted from the electron gun becomes a particle beam with a certain velocity after being charged by the particle accelerator 1 and accelerated by the cyclotron with a given voltage, and then it hits the pressure sensor array with different divergence angles. Finally, this particle beam will be collected by particle beam data collector 6 on the surface of the pressure sensor, and the resistors $R_1$, $R_2$, $R_3$, $R_4$ will be changed by the beams of particles with different velocities. The resistor's change is converted into voltage change internally by the pressure sensor, which is displayed in real time on the data synchronization display 8 after A/D conversion. Because each particle of the emitted particle beam has different emission angles and the velocities thereof are different, the impact force of the particles collected on each sensor is also different, so the mechanical special effect distribution of the charged particle beam can be measured. Let the particles emitted from the accelerator be argon particles, and the maximum emission angle of the argon particle beam formed is $\alpha$, and the maximum emission angle downward is $\beta$. The impact force on the pressure sensor array is the smallest, and the impact force along the horizontal direction is the largest. Taking the horizontal line as the dividing line, the impact force of particles hitting the pressure sensor array gradually decreases as the launch angle increases.

Figure 4A:
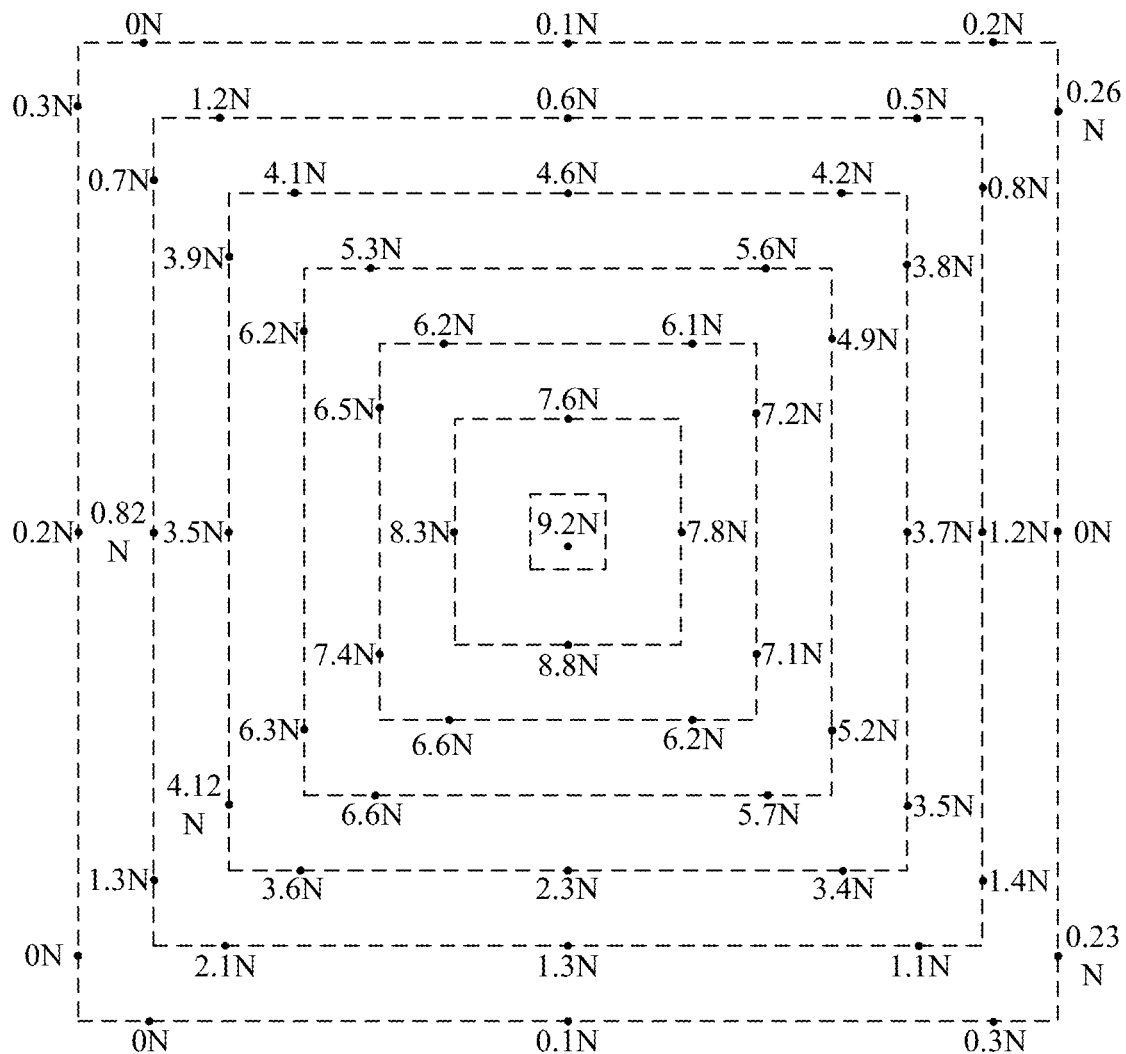
FIGS. 4A-4B are schematic diagrams of the hole's installation method when the data acquisition board is rectangular or circular.

When the distance between particle accelerator 1 and pressure sensor array is 3 meter, for argon particles emitted along horizontal direction (that is, emission angle is) 0°), the argon beam ejected from the electron gun in a pulse time is transmitted through a circular section pipe. Set the section to circle, its radius R is expressed by $\omega$. The bulk density of the particles in the pipe is $n/m^3$, the velocity of the particles is v, and the charge of each particle is $q=6.67\times10^{-26}$ kg. The voltage supplied to the accelerator in the particle processing device is 80 kv, and the time that the argon particle beam spent from the electron gun to the sensor $d_t$ is $6.9\times10^{-7}$s and after processed by data processor 7, the force is 9.2 N shown on the data synchronization display 8 which is the maximum. With the increase of emission angle, the impact force on the pressure sensor array decreases, when the emission angle α and β reach to maximum, that is 8°, the data cannot be collected on the data collector 6, so the range of emission angle is (0°, 8°). The diagram of whole data measured by the rectangular array sensor displayed on the data synchronization display is shown in FIG. 4A.

Example 2

In this example, the same device is used, that is, the sensor array is also a rectangular array, just change the distance and emission voltage of the test. In this example, when the distance between the particle accelerator 1 and the pressure sensor array is 1 meter, the voltage supplied to the accelerator in the particle processing device is 50 kv, For argon particles emitted along the horizontal direction (i.e. emission angle is 0°), the argon beam ejected from the electron gun is transmitted through a circular section pipe in a pulse time. Suppose the section is circle, its radius R is expressed by ω. The volume density of the particles in the pipe is $n/m^3$, the velocity of the particles is expressed by v, the charge of each particle is $q=6.67\times10^{-26}$ kg, the time it spent from the argon beam accelerated from the electron gun to the sensor $d_t$ is $3.2\times10^{-7}$s. After processed by the data processor 7, the maximum force is 15 N, which is shown on the data synchronization display 8. With the increase of emission angle, the impact force on the pressure sensor array decreases, and when the emission angle α and β come up to the maximum, that is 12°, the data cannot be collected on the data collector 6, that is, the range of emission angle is (0°, 12°).

Example 3

Figure 4B:
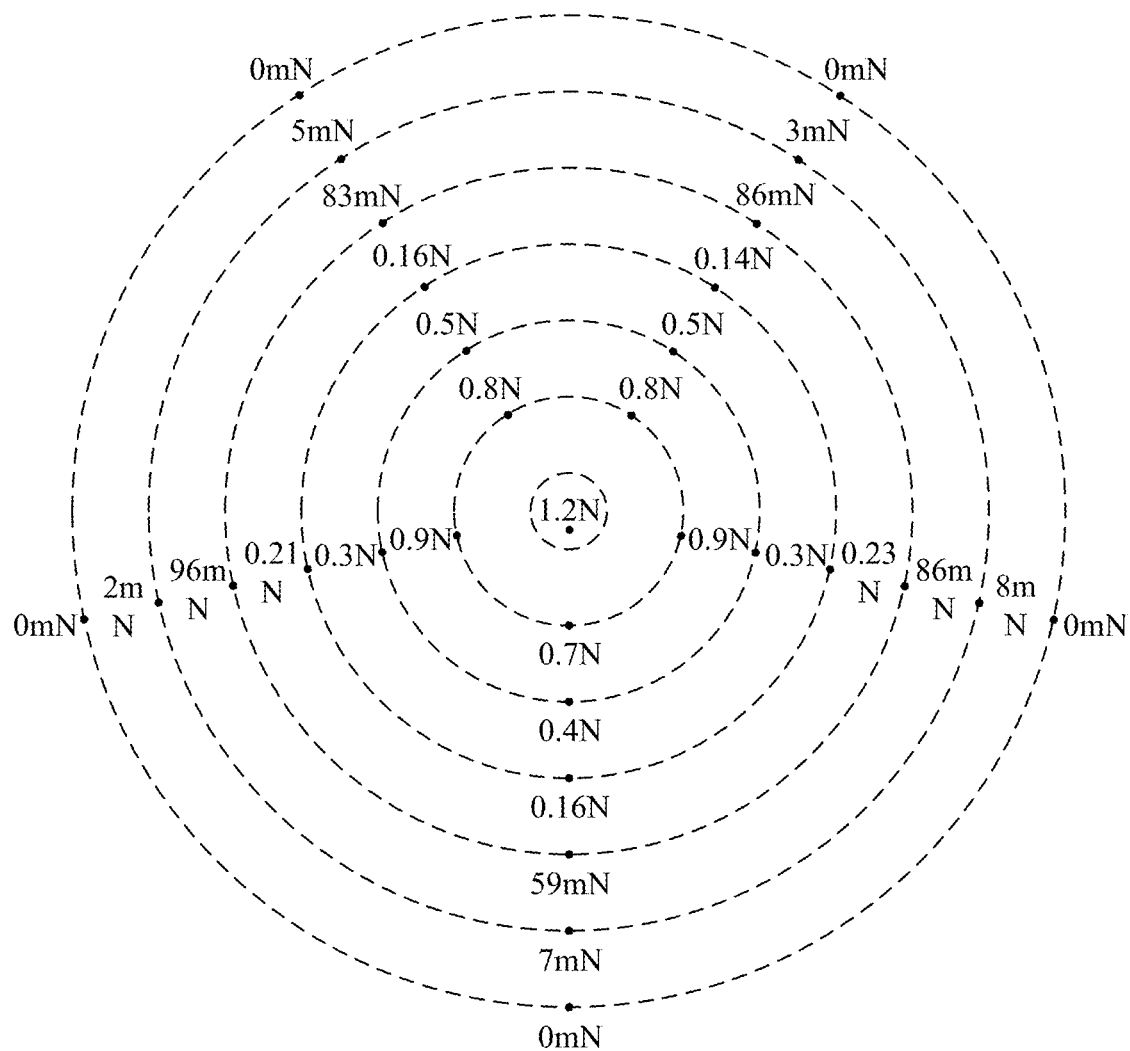
Figure 5:
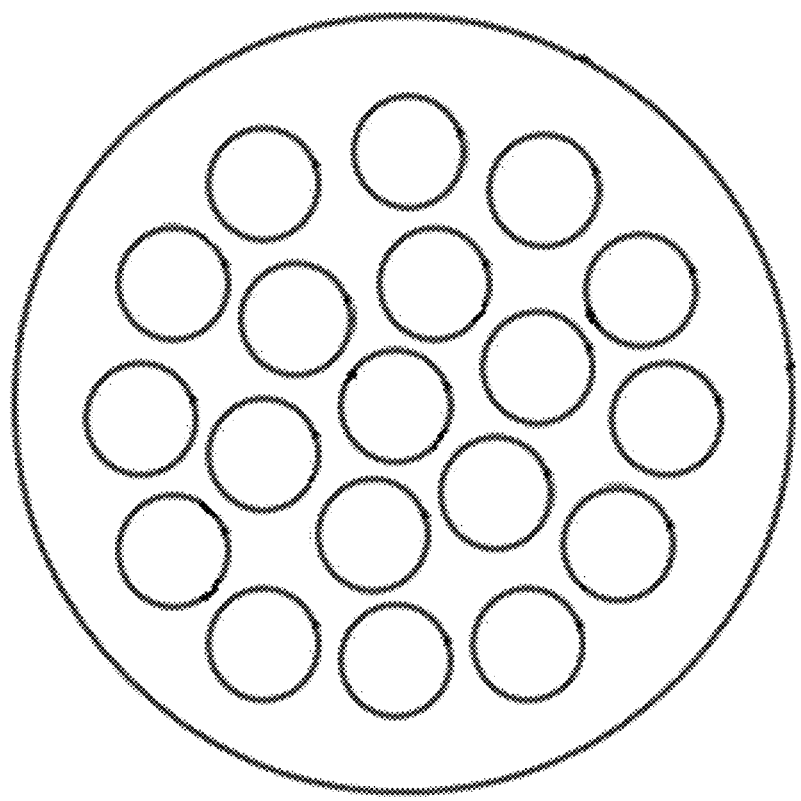
FIG. 5 is a schematic diagram of the front layout when the data acquisition board is circular.

FIG. 5 is a schematic diagram of the front layout of the circular particle beam collection module comprising a pressure sensor. The reverse layout diagram of the circular particle beam collection module comprises a pressure sensor in the disclosure. There is no difference from example 1 at the particle beam measurement principle in this example. Set the distance between particle accelerator 1 and the pressure sensor array to 1 meter, and set the voltage supplied to the accelerator in particle processing device to 5 kv, then the maximum impact force on the data synchronization display 8 is obtained, that is 1.2 N, and when the maximum emission angle α and β are reached to 5°, the data cannot be collected on the data collector 6, so the range of emission angle is (0°, 5°). The diagram of the data measured by the circular array sensor displayed on the data synchronization display is shown in FIG. 4B.

It should be noted that many specific details are described in the above description in order to fully understand the disclosure. However, the measuring device described in the disclosure is not limited to neutral particle beam and argon particle beam. The number of sensors used in the pressure sensor array designed in the disclosure is not limited to 36 (that is rectangular, 6*6) and 19 (that is circular) sensors. Also, the shape of the sensor used in the pressure sensor array is not limited to rectangle or circle, and is suitable for others such as sector, ring or positive side shapes. Therefore, the scope of protection of the disclosure is not limited by the specific embodiments disclosed above.

The invention claimed is:
1. A device, comprising
 a shell comprising a front end and a back end;
 a particle accelerator;
 a data acquisition board;
 a data collector;
 a data processor; and
 a data synchronization display;
 wherein:
  the shell is hollow tubular; the data acquisition board is fixed to the front end of the shell; the data collector and the data processor are fixed together and fixed to the back end of the shell;
  data collected by the data acquisition board is transmitted to the data collector through a data line collector, and the data processor transmits processed data to the data synchronization display;
  the particle accelerator is located in front of the data acquisition board, and particles emitted by the particle accelerator are punched into a front of the data collection board;
  the data acquisition board comprises an insulating ring, an array insulating board, and a pressure sensor;
  the insulating ring is arranged between the array insulating board and the shell, and the array insulating board is embedded in the insulating ring;
  an array is provided with a pressure sensor mounting hole on the array insulating board, and the pressure sensor is installed on a front of the array insulating board corresponding to each pressure sensor mounting hole; and
  the pressure sensor is connected to the data collector from a back of the array insulating board.
2. The device of claim 1, wherein the pressure sensor comprises a pressure sensing surface, a mounting body, a central position positioned on one side of the pressure sensing surface, and a data line transmitting the pressure sensor data passing through the mounting body to connect the pressure sensing surface; the pressure sensing surface is arranged on the front side of the array insulating board; an end diameter of the mounting body is larger than a diameter of the pressure sensor mounting hole, and the mounting body is clamped in the pressure sensor mounting hole; four resistors $R_1$, $R_2$, $R_3$ and $R_4$ and an elastic equalizing beam are disposed in the pressure sensor; the resistor $R_1$ and resistor $R_3$ are pasted on an upper surface of the elastic equalizing beam, and the resistor $R_2$ and resistor $R_4$ are pasted on a lower surface of the elastic equalizing beam; the elastic equalizing beam is hollow and dumbbell-shaped, with its two ends larger than its middle; the resistor is arranged on the upper or lower surface of the elastic equalizing beam corresponding to the two ends of the hollow part, and there is a connection between the resistors $R_1$, $R_2$, $R_3$ and $R_4$ and the data line, a pressure is calculated by measuring the change of the resistor.
3. The device of claim 1, wherein the pressure sensor comprises a power supply end and a data acquisition end; the power supply end of all pressure sensors is connected in equalizing, and the data acquisition end is separately connected to the data collector.
4. The device of claim 1, wherein when the data acquisition board is rectangular, the pressure sensing surface of the pressure sensor is set to rectangle, and when the data acquisition board is circular, the pressure sensing surface of the pressure sensor is set to circle.
5. The device of claim 1, wherein the array insulating board is made of polymer synthetic resin, and the insulation ring is made of polytetrafluoroethylene (PTFE)-based compositions.

* * * * *